United States Patent
Furuta et al.

(10) Patent No.: US 6,921,947 B2
(45) Date of Patent: Jul. 26, 2005

(54) SEMICONDUCTOR DEVICE HAVING RECESSED ISOLATION INSULATION FILM

(75) Inventors: Haruo Furuta, Tokyo (JP); Tomohiro Yamashita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 191 days.

(21) Appl. No.: 10/014,345

(22) Filed: Dec. 14, 2001

(65) Prior Publication Data

US 2002/0074614 A1 Jun. 20, 2002

(30) Foreign Application Priority Data

Dec. 15, 2000 (JP) ........................................ 2000-381822

(51) Int. Cl.[7] .............................................. H01L 29/94
(52) U.S. Cl. ...................................... 257/368; 257/501
(58) Field of Search ................................ 257/368, 369, 257/374, 501, 506, 510; 438/199, 217, 218, 219

(56) References Cited

U.S. PATENT DOCUMENTS

| | | | | |
|---|---|---|---|---|
| 6,333,541 B1 * | 12/2001 | Matsuoka et al. | ........... | 257/391 |
| 6,380,594 B1 * | 4/2002 | Kimizuka | .................... | 257/371 |
| 6,383,877 B1 * | 5/2002 | Ahn et al. | ................... | 438/296 |
| 6,417,037 B1 * | 7/2002 | Feng | ........................... | 438/216 |
| 6,465,866 B2 * | 10/2002 | Park et al. | ................... | 257/510 |
| 6,500,726 B2 * | 12/2002 | Lee et al. | .................... | 438/424 |
| 2002/0179902 A1 * | 12/2002 | Travis et al. | .................. | 257/48 |

FOREIGN PATENT DOCUMENTS

JP         2000-195969         7/2000

* cited by examiner

Primary Examiner—Eddie Lee
Assistant Examiner—Douglas W. Owens
(74) Attorney, Agent, or Firm—Oblon, Spivak, McClelland, Maier & Neustadt, P.C.

(57) ABSTRACT

A semiconductor device and a manufacturing method therefor reduce the occurrence of variation in threshold voltage of a MOS transistor formed by a dual oxide process, thereby to improve manufacturing yield. On the main surface of a semiconductor substrate (1), gate oxide films (GX1, GX2) of different thickness are located in active regions (3A, 3B), respectively, and gate electrodes (GT1, GT2) are located on top of the gate oxide films (GX1, GX2), respectively. An isolation insulating film (2) which defines the active region (3A) in a thick-film portion (AR) has an excessively removed edge portion on the side of a MOS transistor (100) and thereby a recessed portion (DP) is formed in the edge portion of the active region (3A). On the other hand, an edge portion of the isolation insulating film (2) in a thin-film portion (BR) on the side of a MOS transistor (200) is not excessively removed.

8 Claims, 18 Drawing Sheets

F I G. 1 1
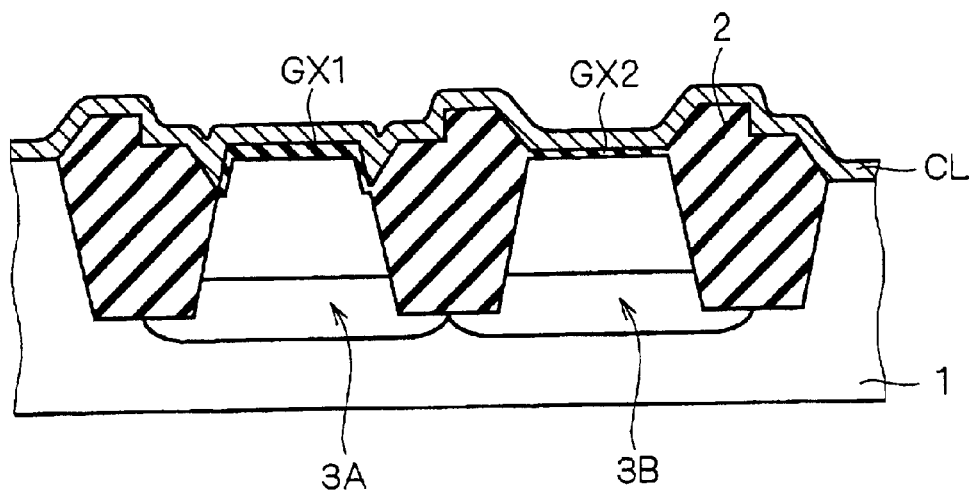
F I G. 1 2
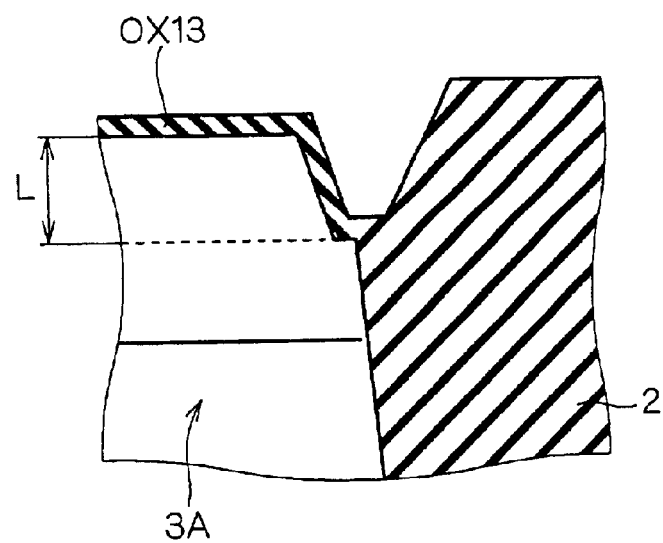

SEMICONDUCTOR DEVICE HAVING RECESSED ISOLATION INSULATION FILM

BACKGROUND OF THE INVENTION

1. Field of the Invention

The present invention relates to a semiconductor device and a method of manufacturing the semiconductor device, especially to MOS transistors with gate insulating films of different thickness and a method of manufacturing such MOS transistors.

2. Description of the Background Art

For cost reduction and performance improvement over semiconductor devices, it is essential to scale down the semiconductor devices. For the scale-downs, a gate insulating film of each MOS transistor needs to be as thin in thickness as the other parts of the transistor. The reduction of the thickness of the gate insulating film, however, causes a reduction in the gate breakdown voltage of the MOS transistor.

While the MOS transistor with a thin gate insulating film is suitable as transistors which make for example a logic circuit for performing a logic operation (the breakdown voltage of which is 2–5 V), it is not suitable for circuit portions such as an input circuit which require a relatively high breakdown voltage (5–10 V).

In recent semiconductor integrated circuit devices which comprise on the same substrate circuit portions operating at different driving voltages (e.g., a logic circuit, an input/output circuit, a memory portion), a plurality of kinds of MOS transistors with gate insulating films of different thickness are properly used depending on the circuit portions, whereby the scale-downs of the semiconductor devices are achieved.

For example, a region where a MOS transistor having a 1- to 4-nm-thick gate insulating film and operating at a driving voltage of 0.8 to 1.8 V is located, is referred to as a "thin-film portion", while a region where a MOS transistor having a 4- to 12-mm-thick gate insulating film and operating at a driving voltage of 1.8 to 5 V is located, is referred to as a "thick-film portion". And each portion is formed of a proper MOS transistor.

Such a technique of using gate insulating films (especially, gate oxide films) of different thickness is called a dual oxide process and is getting important these days.

Referring now to FIGS. 28 and 29, two kinds of MOS transistors 10 and 20 formed by a conventional dual oxide process will be described hereinbelow.

FIG. 28 shows cross-sectional shapes of the MOS transistors 10 and 20 longitudinally of their gates, and FIG. 29 shows cross-sectional shapes thereof transversely of the gates.

As shown in FIGS. 28 and 29, the MOS transistor 10 is formed with a relatively thick gate oxide film in a thick-film portion AR, and the MOS transistor 20 is formed with a relatively thin gate oxide film in a thin-film portion BR.

The MOS transistors 10 and 20 are located in active regions 3A and 3B, respectively, which are defined by an isolation insulating film 2 formed in the surface of a semiconductor substrate 1. The isolation insulating film 2 is a kind of element isolation insulating films called ST1 (Shallow Trench Isolation).

In the surfaces of the active regions 3A and 3B, well regions 4A and 4B are located, respectively, and channel implant regions 5A and 5B are located in the surfaces of the well regions 4A and 4B, respectively.

On the main surface of the semiconductor substrate 1, gate oxide films GX1 and GX2 of different thickness are located in the active regions 3A and 3B, respectively, and gate electrodes GT1 and GT2 are located on top of the gate oxide films GX1 and GX2, respectively.

Further, an interlayer insulation film 6 is located to cover the gate electrodes GT1 and GT2, on top of which planarized interlayer insulation films 7 and 8 are located.

Corresponding to the MOS transistors 10 and 20, contact portions 9A and 9B are provided, respectively, passing through the interlayer insulation films 6 to 8. As shown in FIG. 29, the contact portions 9A and 9B are electrically connected to source/drain regions SDA and SDB of the MOS transistors 10 and 20, respectively. Further as shown, sidewall oxide films OW1 and GW2 are located on the side faces of the gate electrodes GT1 and G12, respectively. The gate electrodes GT1 and GT2 are also connected respectively to the contact portions 9A and 9B, which is however not shown in FIGS. 28 and 29 for convenience's sake.

As shown in FIGS. 28 and 29, the isolation insulating film 2 which defines the active region 3B in the thin-film portion BR has an excessively removed edge portion on the side of the MOS transistor 20, and thereby a recess is formed in the edge portion of the active region 3B.

Next, a method of manufacturing the MOS transistors 10 and 20 will be described step by step with reference to FIGS. 30 to 34.

In a step of FIG. 30, the isolation insulating film 2 is selectively formed in the surface of the semiconductor substrate 1 to define the active regions 3A and 3B. After formation of a thermal oxide film (not shown), the well regions 4A, 4B and the channel implant regions 5A and 5B are formed by impurity ion implantation, more specifically well formation and channel doping, in the active regions 3A and 3B.

In a step of FIG. 31, the main surfaces of the active regions 3A and 3B are thermally oxidized to form an oxide film OX3 of a third thickness. Here, the "third thickness" is defined as a resultant thickness from subtraction of a second thickness from a first thickness, where the first and second thicknesses are respectively the thicknesses of the gate oxide films GX1 and GX2 to be formed later.

In a step of FIG. 32, a resist pattern RM1 is formed by a photolithographic technique to cover the thick-film portion AR.

Then, the oxide film OX3 in the thin-film portion BR is removed by wet etching for a predetermined period of time. At this time, the edge portion of the isolation insulating film 2 formed of an oxide film is excessively removed and thereby the active region 3B is protruded.

After removal of the resist pattern RM1, in a step of FIG. 33, the oxide film OX3 is increased in thickness to form the gate oxide film GX1 of the first thickness on top of the active region 3A. At this time, the gate oxide film GX2 of the second thickness is formed on top of the active region 3B.

In a step of FIG. 34, a conducting layer CL is formed to cover the gate oxide films GX1 and GX2.

The conducting layer CL is patterned to form the gate electrodes GT1 and GT2. With the gate electrodes GT1 and GT2 as masks, ion implantation is carried out to form the source/drain regions SDA and SDB in the active regions 3A and 3B, respectively.

After the interlayer insulation films 6 to 8 are stacked one above the other over the whole surface, the contact portions 9A and 9B are formed, reaching the source/drain regions SDA and SDB respectively through the interlayer insulation films 6 to 8. This provides the MOS transistors 10 and 20 shown in FIGS. 28 and 29.

In the conventional dual oxide process, as has been described, the oxide film OX3 is once formed and then removed by wet etching to form the thin gate oxide film GX2 in the thin-film portion BR. The edge portion of the isolation insulating film 2 is thus excessively removed and thereby the active region 3B is protruded.

FIG. 35 shows the details of a region X in FIG. 33. As shown in FIG. 35, a depth of an excessively removed portion of the edge portion of the isolation insulating film 2 which faces the active region 3B is 5 nm (50 Å) or less, the depth being defined as a depth between the main surface of the active region 3B and the deepest part of the recess. The horizontal distance between the active region 3B and the isolation insulating film 2 is 0.1 μm or less and the angle of inclination of the protruded portion of the active region 3B ranges from 65° to 90°.

Such an excessively removed portion of the edge portion of the isolation insulating film 2 causes a reduction in threshold voltage due to an inverse narrow-channel effect. Further, the depth of an excessively removed portion varies depending on the time for wet etching of the oxide film OX3 in the thin-film portion BR.

Consequently, the threshold voltage varies depending on the depth of an excessively removed portion of the edge portion of the isolation insulating film 2, which considerably reduces manufacturing yield of the semiconductor device.

SUMMARY OF THE INVENTION

A first aspect of the present invention is directed to a semiconductor device comprising: a semiconductor substrate; an isolation insulating film selectively located in a surface of the semiconductor substrate; and first and second transistors located respectively on first and second active regions which are defined by the isolation insulating film. The first transistor has a first gate insulating film of a first thickness which is selectively located on the first active region, and the second transistor has a second gate insulating film of a second thickness which is selectively located on the second active region. The first thickness is greater than the second thickness. The isolation insulating film has a recessed portion in an edge portion on the side of either the first or second active region, the recessed portion being located around either the first or second active region. A depth of the recessed portion is defined as a depth at which threshold voltage of either the first or second transistor is substantially constant according to a characteristic of variation in threshold voltage of either the first or second transistor with respect to variation in depth of the recessed portion.

According to a second aspect of the present invention, the depth at which threshold voltage of either the first or second transistor is substantially constant is a depth at which a range of variation in threshold voltage of either the first or second transistor is 5 to 10% of a maximum range of variation according to the characteristic of variation.

According to a third aspect of the present invention, the depth of the recessed portion is defined as a vertical height between a main surface of the first active region and a deepest part of the recessed portion, and is not less than 10 nm.

A fourth aspect of the present invention is directed to a semiconductor device comprising: a semiconductor substrate; an isolation insulating film selectively located in a surface of the semiconductor substrate; and first and second transistors located respectively on first and second active regions which are defined by the isolation insulating film, the first transistor having a first gate insulating film of a first thickness which is selectively located on the first active region, the second transistor having a second gate insulating film of a second thickness which is selectively located on the second active region, the first thickness being greater than the second thickness, the isolation insulating film having a recessed portion in an edge portion on the side of the first active region, the recessed portion being located around the first active region.

According to a fifth aspect of the present invention, the depth of the recessed portion is defined as a vertical height between a main surface of the first active region and a deepest part of the recessed portion, and is not less than 10 nm.

According to a sixth aspect of the present invention, the isolation insulating film has another recessed portion shallower than the recessed portion located around the first active region, in an edge portion on the side of the second active region, the shallower recessed portion is located around the second active region.

A seventh aspect of the present invention is directed to a semiconductor device comprising: a semiconductor substrate; an isolation insulating film selectively located in a surface of the semiconductor substrate; and a first transistor located on a first active region defined by the isolation insulating film, the first transistor having a first gate insulating film of a first thickness which is selectively located on the first active region, the isolation insulating film having a first recessed portion in an edge portion on the side of the first active region, the first recessed portion being located around the first active region, a depth of the first recessed portion being defined as a vertical height between a main surface of the first active region and a deepest part of the first recessed portion and being not less than 10 nm.

According to an eighth aspect of the present invention, the semiconductor device further comprises: a second transistor located on a second active region which is defined by the isolation insulating film as being different from the first active region in the surface of the semiconductor substrate, the second transistor having a second gate insulating film of a second thickness which is selectively located on the second active region, the first thickness being greater than the second thickness, the isolation insulating film having a second recessed portion in an edge portion on the side of the second active region, the second recessed portion being located around the second active region, a depth of the second recessed portion being defined as a vertical height between a main surface of the second active region and a deepest part of the second recessed portion and being not less than 10 nm.

According to a ninth aspect of the present invention, the semiconductor device further comprises: a second transistor located on a second active region which is defined by the isolation insulating film as being different from the first active region in the surface of the semiconductor substrate, the second transistor having a second gate insulating film of a second thickness which is selectively located on the second active region, the first thickness being greater than the second thickness, the isolation insulating film having a second recessed portion in an edge portion on the side of the second active region, the second recessed portion being located around the second active region.

According to a tenth aspect of the present invention, the first transistor includes a transistor forming an input/output circuit, and the second transistor includes a transistor forming an analog circuit.

An eleventh aspect of the present invention is directed to a method of manufacturing a semiconductor device comprising the steps of: (a) selectively forming an isolation insulating film in a surface of a semiconductor substrate to define first and second active regions; (b) forming a silicon nitride film over a whole surface; (c) removing the silicon nitride film from on the first active region and from on top of an edge portion of the isolation insulating film on the side of the first active region; (d) with a remainder of the silicon nitride film as a mask, removing the edge portion of the isolation insulating film on the side of the first active region, to form a recessed portion around an edge portion of the first active region; (e) forming an insulation film on a surface of the first active region; and (f) after removal of the remainder of the silicon nitride film, increasing the insulation film in thickness to form a first gate insulating film of a first thickness and to form on a surface of the second active region, a second gate insulating film having a thickness corresponding to an increment of the thickness of the insulation film. The step (d) includes the step of forming the recessed portion to a depth at which threshold voltage of the first transistor is substantially constant according to a characteristic of variation in threshold voltage of the first transistor with respect to variation in depth of the recessed portion.

According to a twelfth aspect of the present invention, the depth at which threshold voltage of the first transistor is substantially constant is a depth at which a range of variation in threshold value of the first transistor is 5 to 10% of a maximum range of variation according to the characteristic of variation.

A thirteenth aspect of the present invention is directed to a method of manufacturing a semiconductor device comprising the steps of: (a) selectively forming an isolation insulating film in a surface of a semiconductor substrate to define first and second active regions; (b) forming a silicon nitride film over a whole surface; (c) removing the silicon nitride film from on the first active region and from on top of an edge portion of the isolation insulating film on the side of the first active region; (d) with a remainder of the silicon nitride film as a mask, removing the edge portion of the isolation insulating film on the side of the first active region, to form a recessed portion around an edge portion of the first active region; (e) forming an insulation film on a surface of the first active region; and (f) after removal of the remainder of the silicon nitride film, increasing the insulation film in thickness to form a first gate insulating film of a first thickness and to form on a surface of the second active region, a second gate insulating film having a thickness corresponding to an increment of the thickness of the insulation film. A depth of the recessed portion is defined as a vertical height between a main surface of the first active region and a deepest part of the recessed portion. The step (d) includes the step of forming the recessed portion to a depth of not less than 10 nm.

A fourteenth aspect of the present invention is directed to a method of manufacturing a semiconductor device comprising the steps of: (a) selectively forming an isolation insulating film in a surface of a semiconductor substrate to define first and second active regions; (b) forming an insulation film on surfaces of the first and second active regions; (c) selectively forming a resist pattern to cover the insulation film on the first active region and an edge portion of the isolation insulating film on the side of the first active region; (d) with the resist pattern as a mask, removing the insulation film on the second active region, and an edge portion of the isolation insulating film on the side of the second active region, to form a recessed portion around an edge portion of the second active region; and (e) after removal of the resist pattern, increasing the insulation film in thickness to form a first gate insulating film of a first thickness and to form on a surface of the second active region, a second gate insulating film having a thickness corresponding to an increment of the thickness of the insulation film. The step (d) includes the step of forming the recessed portion to a depth at which threshold voltage of the second transistor is substantially constant according to a characteristic of variation in threshold voltage of the second transistor with respect to variation in depth of the recessed portion.

According to a fifteenth aspect of the present invention, the depth at which threshold voltage of the second transistor is substantially constant is a depth at which a range of variation in threshold voltage of the second transistor is 5 to 10% of a maximum range of variation according to the characteristic of variation.

A sixteenth aspect of the present invention is directed to a method of manufacturing a semiconductor device comprising the steps of: (a) selectively forming an isolation insulating film in a surface of a semiconductor substrate to define first and second active regions; (b) forming an insulation film on surfaces of the first and second active regions; (c) selectively forming a resist pattern to cover the insulation film on the first active region, and an edge portion of the isolation insulating film on the side of the first active region; (d) with the resist pattern as a mask, removing the insulation film on the second active region, and an edge portion of the isolation insulating film on the side of the second active region, to form a recessed portion around an edge portion of the second active region; and (e) after removal of the resist pattern, increasing the insulation film in thickness to form a first gate insulating film of a first thickness and to form on a surface of the second active region, a second gate insulating film having a thickness corresponding to an increment of the thickness of the insulation film. A depth of the recessed portion is defined as a vertical height between a main surface of the first active region and a deepest part of the recessed portion. The step (d) includes the step of forming the recessed portion to a depth of not less than 10 nm.

In the semiconductor device of the first aspect, the isolation insulating film has a recessed portion in an edge portion on the side of either the first or second active region, the recessed portion being located around either the first or second active region. The depth of the recessed portion is set to a depth at which the threshold voltage of either the first or second transistor is substantially constant according to the characteristic of variation in the threshold voltage of either the first or second transistor with respect to variation in the depth of the recessed portion. Therefore, even if the depth of the recessed portion varies, there would be less variation in threshold voltage due to the inverse narrow-channel effect. This improves manufacturing yield of the semiconductor device.

The semiconductor device of the second aspect can more specifically determine the depth of the recessed portion. The semiconductor device of the third aspect can more specifically determine the depth of the recessed portion.

The semiconductor device of the fourth aspect can reduce variation in threshold voltage due to the inverse narrow-channel effect, for example, by forming the recessed portion to such a depth as to reliably reduce the variation in threshold voltage.

The semiconductor device of the fifth aspect can more specifically determine the depth of the recessed portion.

The semiconductor device of the sixth aspect can be provided with a more practical configuration.

The semiconductor device of the seventh aspect has the first recessed portion around the first active region, the depth of the first recessed portion being defined as a vertical height between the main surface of the first active region and the deepest part of the first recessed portion and being not less than 10 nm. This reliably reduces variation in threshold voltage due to the inverse narrow-channel effect occurring in the first transistor.

The semiconductor device of the eighth aspect has the second recessed portion around the second active region, the depth of the second recessed portion being not less than 10 nm. This reliably reduces variation in threshold voltage due to the inverse narrow-channel effect occurring in the first and second transistors.

The semiconductor device of the ninth aspect has the second recessed portion around the second active region. Thus, variation in threshold voltage due to the inverse narrow-channel effect can be reduced, for example, by forming the recessed portion to such a depth as to reliably reduce the variation in threshold voltage.

The semiconductor device of the tenth aspect can achieve a configuration that is suitable for forming the analog circuit and the input/output circuit on one substrate.

The method of the eleventh aspect provides two kinds of transistors with the first and second gate insulating films of different thickness. In the process of manufacturing, a recessed portion is formed around the edge portion of the first active region to a depth at which the threshold voltage of the first transistor is substantially constant according to the characteristic of variation in the threshold voltage of the first transistor with respect to variation in the depth of the recessed portion. Therefore, even if the depth of the recessed portion varies, there would be less variation in threshold voltage due to the inverse narrow-channel effect. This improves manufacturing yield of the semiconductor device.

The method of the twelfth aspect can more specifically determine the depth of the recessed portion.

The method of the thirteenth aspect provides two kinds of transistors with the first and second gate insulating films of different thickness. In the process of manufacturing, a recessed portion is formed to a depth of not less than 10 nm around the first active region. Therefore, even if the depth of the recessed portion varies, there would be less variation in threshold voltage due to the inverse narrow-channel effect. This improves manufacturing yield of the semiconductor device.

The method of the fourteenth aspect provides two kinds of transistors with the first and second gate insulating films of different thickness. In the process of manufacturing, a recessed portion is formed around the second active region to a depth at which the threshold voltage of the second transistor is substantially constant according to the characteristic of variation in the threshold voltage of the second transistor with respect to variation in the depth of the recessed portion. Therefore, even if the depth of the recessed portion varies, there would be less variation in threshold voltage due to the inverse narrow-channel effect. This improves manufacturing yield of the semiconductor device.

The method of the fifteenth aspect can more specifically determine the depth of the recessed portion.

The method of the sixteenth aspect provides two kinds of transistors with the first and second gate insulating films of different thickness. In the process of manufacturing, a recessed portion is formed to a depth of not less than 10 $\mu$m around the second active region. Therefore, even if the depth of the recessed portion varies, there would be less variation in threshold voltage due to the inverse narrow-channel effect. This improves manufacturing yield of the semiconductor device.

An object of the present invention is to provide a semiconductor device and a manufacturing method therefor that reduce the occurrence of variation in the threshold voltage of a MOS transistor formed by the dual oxide process, thereby to improve manufacturing yield.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 11 are cross-sectional views for explaining a manufacturing process for the semiconductor device according to the first preferred embodiment of the present invention;

FIG. 12 shows part of the configuration of the semiconductor device according to the first preferred embodiment of the present invention;

DESCRIPTION OF THE PREFERRED EMBODIMENTS

A. First Preferred Embodiment

A-1. Device Configuration

Figure 1:
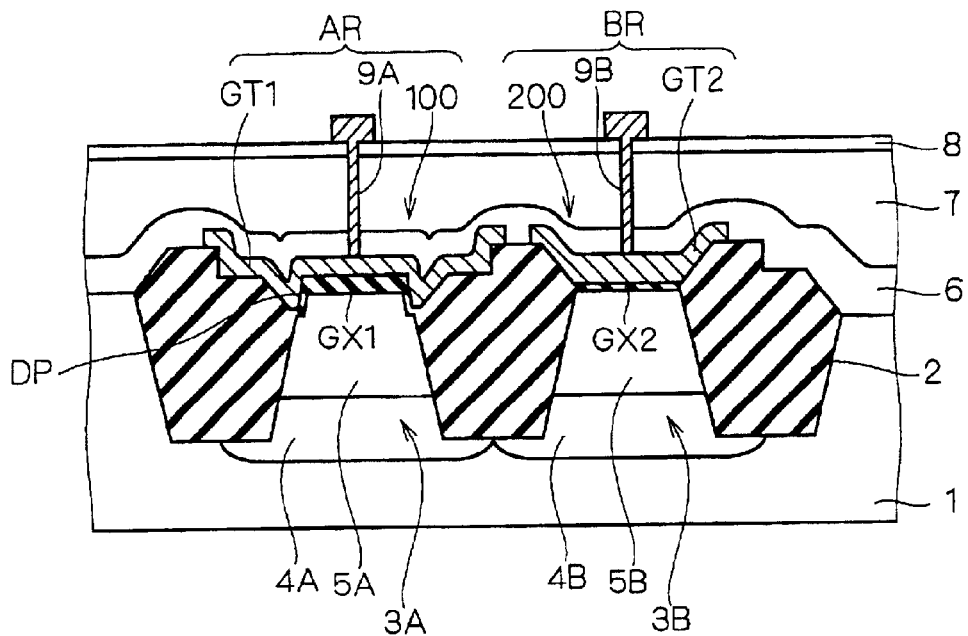
FIGS. 1 and 2 are cross-sectional views for explaining a configuration of a semiconductor device according to a first preferred embodiment of the present invention.
Figure 2:
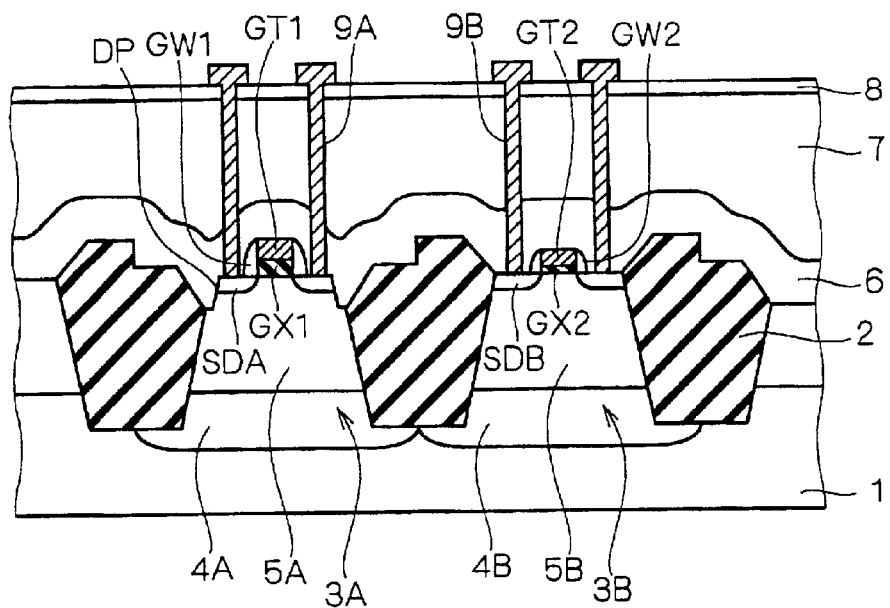

Referring to FIGS. 1 and 2, two kinds of MOS transistors 100 and 200 formed by a dual oxide process according to the present invention will be described.

FIG. 1 shows cross-sectional shapes of the MOS transistors 100 and 200 longitudinally of their gates, and FIG. 2 shows the cross-sectional shapes thereof transversely of the gates.

As shown in FIGS. 1 and 2, the MOS transistor 100 is formed with a relatively thick gate oxide film in a thick-film portion AR, and the MOS transistor 200 is formed with a relatively thin gate oxide film in a thin-film portion BR.

The MOS transistors 100 and 200 are located in active regions 3A and 3B, respectively, which are defined by an isolation insulating film 2 formed in the surface of a semiconductor substrate 1. The isolation insulating film 2 is a kind of element isolation insulating films called STI (Shallow Trench Isolation).

In the surfaces of the active regions 3A and 3B, well regions 4A and 4B are located, respectively, and channel implant regions 5A and 5B are located in the surfaces of the well regions 4A and 4B, respectively.

On the main surface of the semiconductor substrate 1, gate oxide films GX1 and GX2 of different thickness are located in the active regions 3A and 3B, respectively, and gate electrodes GT1 and GT2 are located on top of the gate oxide films GX1 and GX2, respectively.

Further, an interlayer insulation film 6 is located to cover the gate electrodes GT1 and GT2, on top of which planarized interlayer insulation films 7 and 8 are located.

Corresponding to the MOS transistors 100 and 200, contact portions 9A and 9B are provided, respectively, passing through the interlayer insulation films 6 to 8. As shown in FIG. 2, the contact portions 9A and 9B are electrically connected to source/drain regions SDA and SDB of the MOS transistors 100 and 200, respectively. Further as shown, sidewall oxide films GW1 and GW2 are located on the side faces of the gate electrodes GT1 and GT2, respectively.

The gate electrodes GT1 and GT2 are also connected to the contact portions, which is however not shown in FIG. 2 for convenience's sake.

As shown in FIGS. 1 and 2, the isolation insulating film 2 which defines the active region 3A in the thick-film portion AR has an excessively removed edge portion on the side of the MOS transistor 100 and thereby a recessed portion DP is formed in the edge portion of the active region 3A. On the other hand, an edge portion of the isolation insulating film 2 on the side of the MOS transistor 200 in the thin-film portion BR is not removed very much, and even if it is removed, the amount of removal is very little and a resultant recess is much shallower than the recessed portion DP in the thick-film portion AR.

A-2. Manufacturing Method

Next, a method of manufacturing the MOS transistors 100 and 200 will be described step by step with reference to FIGS. 3 to 11.

Figure 3:
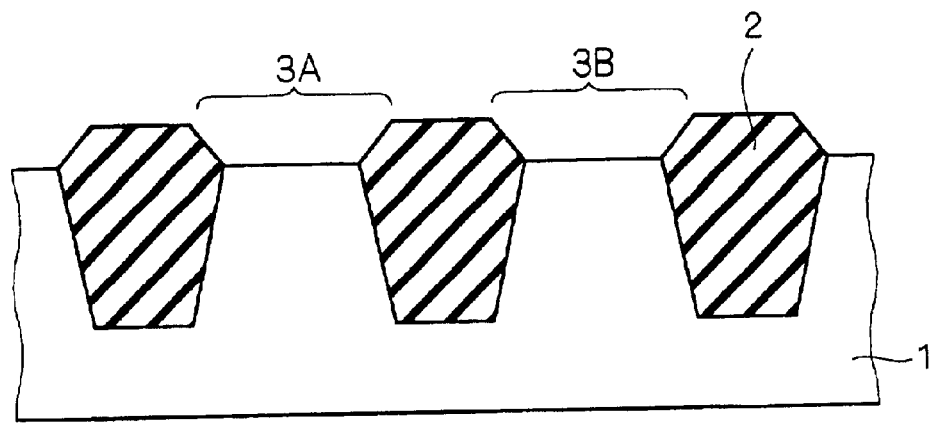

In a step of FIG. 3, the isolation insulating film 2 is selectively formed in the surface of the semiconductor substrate 1 to define the active regions 3A and 3B.

Figure 4:
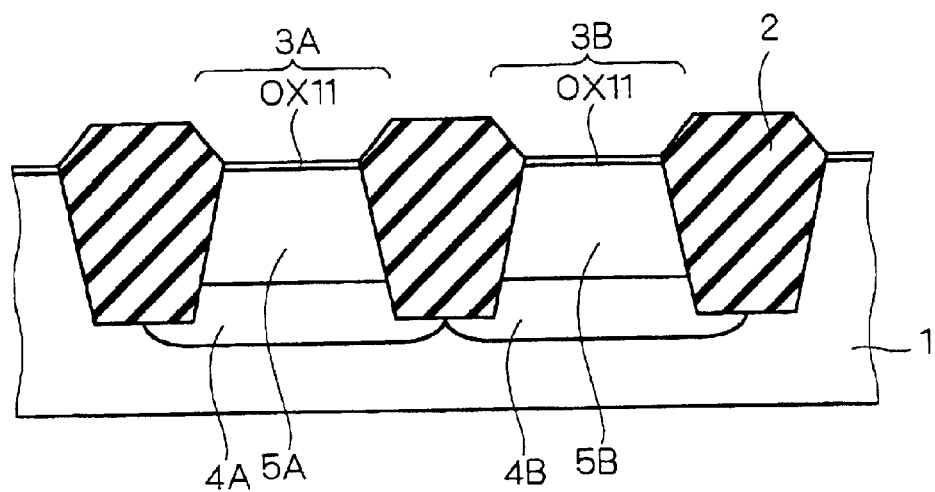

In a step of FIG. 4, after an oxide film OX11 is formed by thermal oxidation on the active regions 3A and 3B, the well regions 4A, 4B and the channel implant regions 5A, 5B are formed by impurity ion implantation, more specifically well formation and channel doping, in the active regions 3A and 3B.

In the well formation, for formation of a p-well region, boron ions as impurities are implanted in both the active regions 3A and 3B with an energy of 200 to 500 keV at a dose of $5 \times 10^{12}$ to $1 \times 10^{14}/cm^2$.

Then, boron ions are further implanted with an energy of 80 to 160 keV at a dose of $3 \times 10^{12}$ to $2 \times 10^{15}/cm^2$ to form a channel cut layer.

In the channel doping, boron ions are implanted in the active region 3A with an energy of 15 to 70 keV at a dose of $3 \times 10^{12}$ to $5 \times 10^{13}/cm^2$ and implanted in the active region 3B with an energy of 15 to 70 keV at a dose of $5 \times 10^{12}$ to $1 \times 10^{14}$ cm$^2$. In FIG. 4, the channel cut layer integrated with the channel implant regions is shown as the channel implant regions 5A and 5B. The same can be said of the other drawings.

For formation of an n-well region, on the other hand, phosphorus ions as impurities are implanted in both the active regions 3A and 3B with an energy of 300 to 1,000 keV at a dose of $5 \times 10^{12}$ to $1 \times 10^{14}/cm^2$.

Then, phosphorus ions are further implanted with an energy of 160 to 400 keV at a dose of $3 \times 10^{12}$ to $2 \times 10^{13}/Cm^2$ to form a channel cut layer.

In the channel doping, arsenic ions are implanted in the active region 3A with an energy of 15 to 70 keV at a dose of $3 \times 10^{12}$ to $5 \times 10^{13}$ cm$^2$ and implanted in the active region 3B with an energy of 50 to 200 keV at a dose of $5 \times 10^{12}$ to $1 \times 10^{14}/cm^2$.

Figure 5:
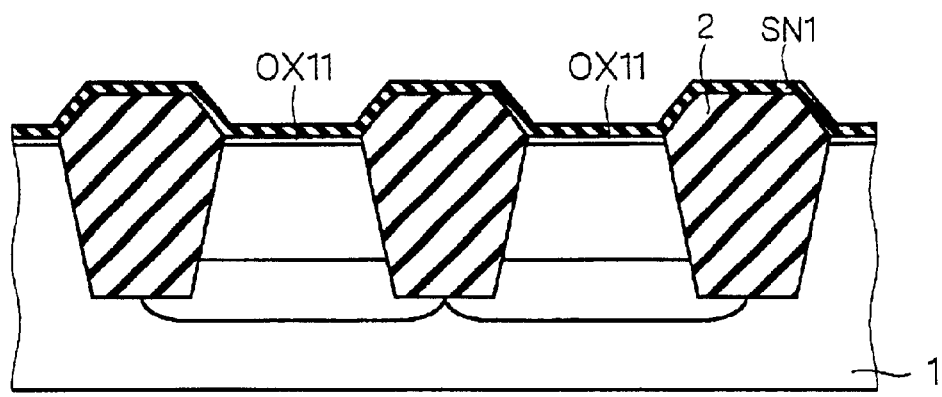

In a step of FIG. 5, a silicon nitride film SN1 is formed to a thickness of 5 to 30 nm (50–300 Å) over the whole surface.

Figure 6:
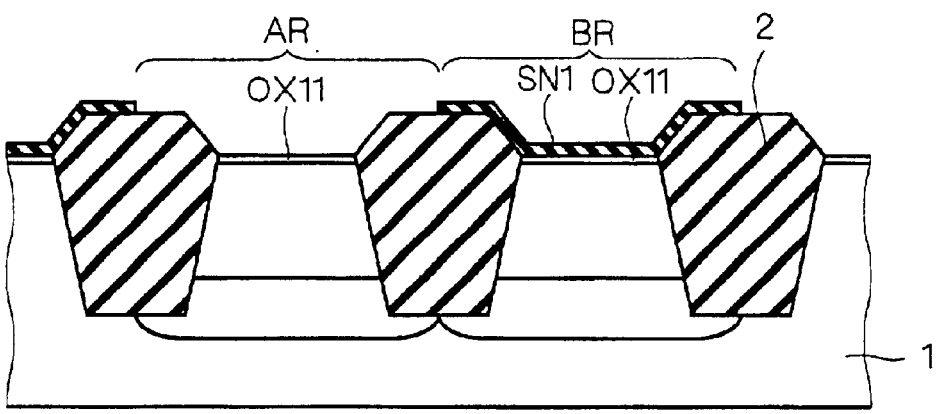

In a step of FIG. 6, the silicon nitride film SN1 is selectively removed by wet etching so that only the silicon nitride film SN1 in the thick-film portion AR is removed.

Figure 7:
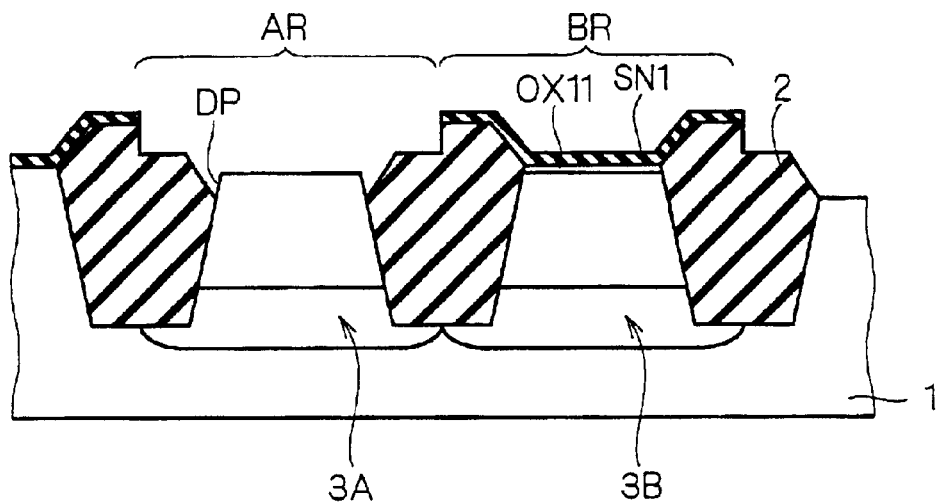

In a step of FIG. 7, by wet etching of the silicon oxide film with the silicon nitride film SN1 as a mask, the oxide film OX11 in the thick-film portion AR is removed and also the edge portion of the isolation insulating film 2 is removed. Thereby a deep recessed portion DP is formed around the active region 3A.

Figure 8:
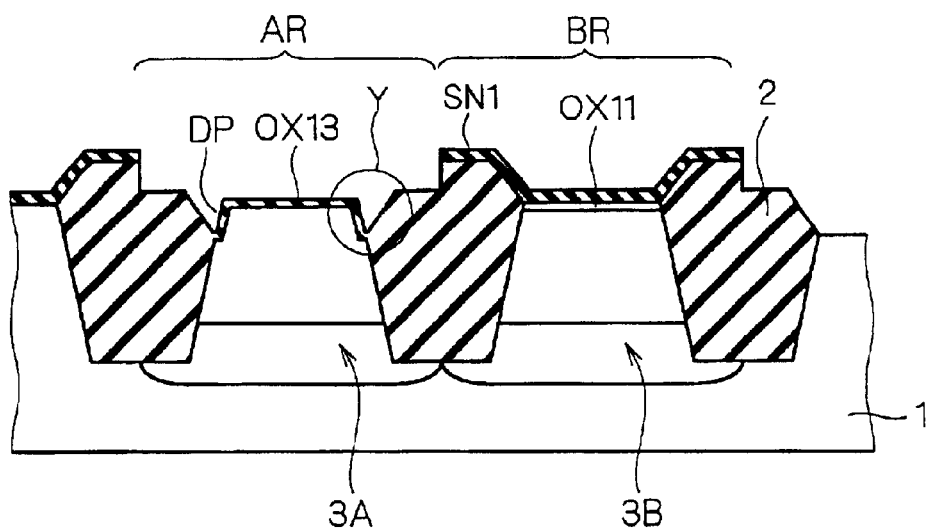

In a step of FIG. 8, with the silicon nitride film SN1 left in the thin-film portion BR, an oxide film OX13 of a third thickness is formed only on the surface of the active region 3A. Here, the "third thickness" is defined as a resultant thickness of subtraction of a second thickness from a first thickness, where the first thickness (4–12 nm) and the second thickness (1–4 nm) are respectively the thicknesses of the gate oxide films GX1 and GX2 to be formed later.

Figure 9:
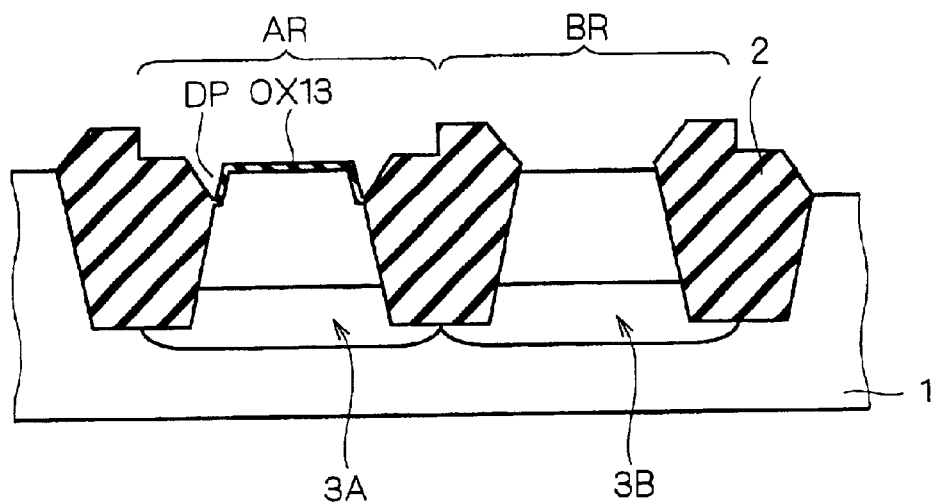

In a step of FIG. 9, the silicon nitride film SN1 in the thin-film portion BR is removed by etching. This etching is conditioned not to remove the silicon oxide film; therefore, the silicon oxide film is hardly removed from the thick-film portion AR and the thin-film portion BR.

Although the isolation insulating film 2 and the oxide film OX13 in the thick-film portion AR are slightly removed by the removal of the oxide film OX11 from the active region 3B, the thickness of the oxide film OXI1 is so small that there is little influence. Alternatively, the influence of the removal of the oxide film OX1I can be cancelled by increasing the thickness of the oxide film OX13 by the thickness of the oxide film OX11.

Figure 10:
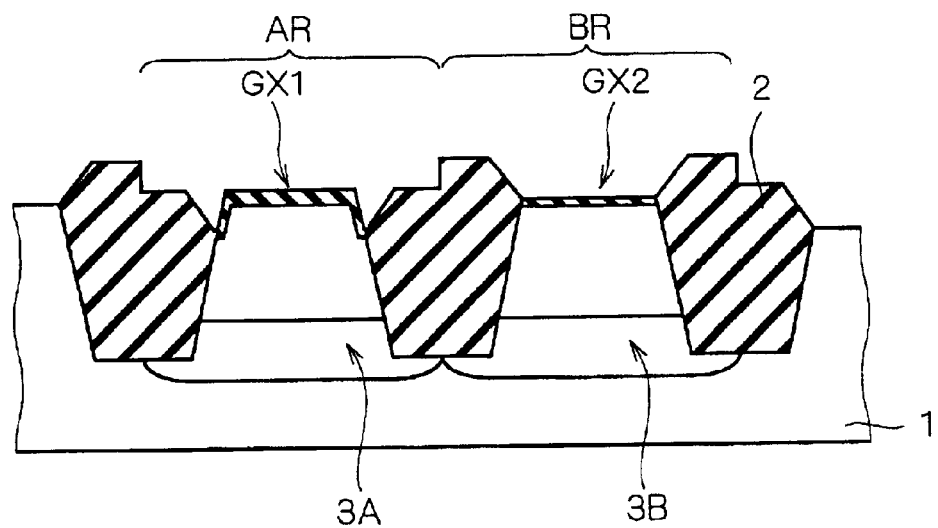

In a step of FIG. 10, the oxide film OX13 is increased in thickness by thermal oxidation or chemical vapor deposition (CVD) to form the gate oxide film GX1 of the first thickness on the active region 3A. At this time, the gate oxide film GX2 of the second thickness is formed on the active region 3B.

In a step of FIG. 11, a conducting layer CL to be the gate electrodes GT1 and GT2 is formed to cover the gate oxide films GX1 and GX2.

The conducting layer CL is then patterned to form the gate electrodes GT1 and GT2. With the gate electrodes GT1 and GT2 as masks, ion implantation is carried out to form the source/drain regions SDA and SDB in the active regions 3A and 3B, respectively.

Here the source/drain implants are performed under the conditions that for formation of a p-well region, arsenic ions are implanted with an energy of 3 to 100 keV at a dose of $1\times10^{15}$ to $6\times10^{15}/cm^2$, while for formation of an n-well region, boron ions are implanted with an energy of 1 to 20 keV at a dose of $1\times10^{15}$ to $6\times10^{15}/cm^2$.

After the interlayer insulation films 6 to 8 are laminated one above the other over the whole surface, the contact portions 9A and 9B are formed, reaching the source/drain regions SDA and SDB respectively through the interlayer insulation films 6 to 8. This provides the MOS transistors 100 and 200 shown in FIGS. 1 and 2.

A-3. Effects

FIG. 12 shows the details of a region Y in FIG. 8. As shown in FIG. 12, a depth L of the recessed portion DP around the active region 3A at this stage should preferably be about 10 nm (100 Å) at the minimum, the depth being defined as a depth between the main surface of the deepest part of the recessed portion DP. For that, it is desirable that the depth L of the recessed portion DP formed in the step of FIG. 8 be determined in consideration of lowering of the main surface level of the active region 3A by the formation of the oxide film OX13.

Now, why the depth L of the recessed portion DP around the active region 3A should be at least about 10 nm will be described hereinbelow.

Figure 13:
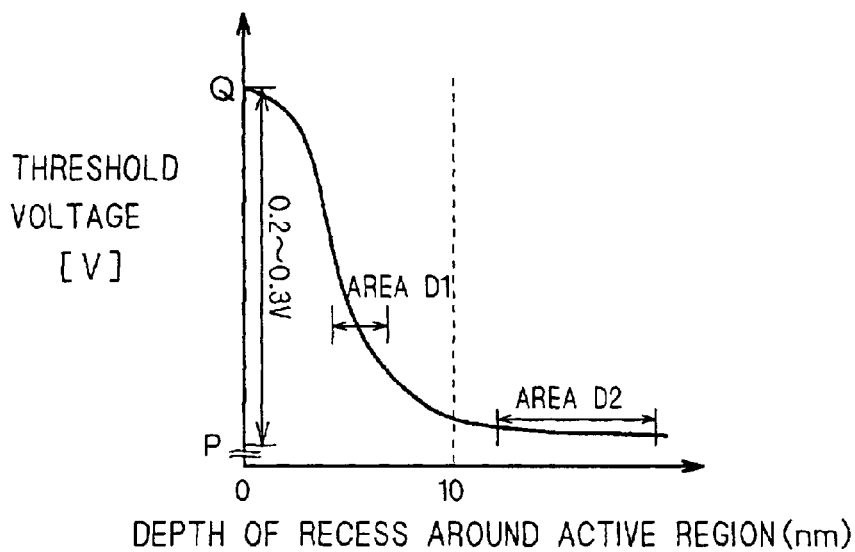
FIG. 13 shows the dependency of threshold voltage on variation in the depth of a recessed portion around an active region.

FIG. 13 shows the relationship between the threshold voltage (Vth) of a MOS transistor and the depth of a recess in the edge portion of STI (isolation insulating film 2), i.e., the depth of a recess around the active region.

In FIG. 13, the horizontal axis indicates the depth (nm) of a recess around the active region, and the vertical axis indicates the threshold voltage (V) of a MOS transistor. The depth of a recess being 0 corresponds to a case where the edge portion of STI is not excessively removed, i.e., it corresponds to a design value.

As shown in FIG. 13, when the depth of a recess around the active region is relatively shallow, e.g., shallower than 10 nm, there occur considerable variations in threshold voltage due to an inverse narrow-channel effect responsive to variations in the depth of the recess. More specifically, a range of variation in threshold voltage responsive to the 0.10-nm range of variation in the depth of a recess is close to 0.2 to 0.3 V which is the maximum range of variation.

The maximum range of variation corresponds to a difference between the threshold voltage at a depth (i.e., point P in FIG. 13) that causes little variation (substantially constant) in threshold voltage as the depth of a recess increases, and the threshold voltage when the depth of the recess is 0 (i.e., point Q in FIG. 13).

Conventionally it has been known that the threshold voltage depends upon the depth of a recess around the active region, but there is little understanding of the exact characteristics thereof. Conventional MOS transistors therefore have been formed with a relatively shallow recess (about 4–7 nm) as indicated by an area D1 of FIG. 13.

The inventors of the present invention, on the other hand, have made a wide range of variations in the depth of a recess, thereby to obtain data about the dependency of threshold value as graphically shown in FIG. 13.

The inventors have then reached a conclusion that as shown in FIG. 13, if a recess around the active region has a relatively great depth of 10 nm or more, there would occur little variation in threshold voltage even if the depth of the recess somewhat varies as indicated by an area D2.

When the depth of a recess around the active region is 10 rn or more, a range of variation in threshold value is 0.03 to 0.04 V which is about 5 to 10% of the maximum range of variation.

By forming the recessed portion DP around the active region 3A to a depth of at least about 10 nm, the occurrence of variation in threshold value due to the inverse narrow-channel effect can be reduced even if the depth of the recessed portion DP varies. This improves manufacturing yield of the semiconductor device.

In consideration of variations in manufacture, the recessed portion DP in each semiconductor device should be of a depth of 10 nm or more, even in the semiconductor device with the shallowest recessed portion DP.

Although some variation in threshold voltage occurs in the MOS transistor 100, the thick gate oxide film GX1 (4–12 nm), high driving voltage of 1.8 to 5 V, and high threshold voltage of 0.4 to 1.5 V of the MOS transistor 100 makes the allowable range of variation in threshold voltage wider than that for the MOS transistor 200 formed in the thin-film portion BR; therefore, there is little influence on manufacturing yield.

In order to form the recessed portion DP to a depth of about 10 nm around the active region 3A, the time for wet etching in the step of FIG. 7 should be lengthened than before.

For example, if a conventional etching process produces a recessed portion of about 5 nm in depth, the recessed portion DP of about 10 nm in depth can be formed by doubling the conventional etch time.

The MOS transistor 100 is suitable for circuit portions which require a relatively high threshold voltage (5–10 V), such as an input/output circuit (including individual input and output circuits).

In the MOS transistor 200 in the thin-film portion BR shown in FIG. 1, there is no recess around the active region 3B. Therefore, no reduction in the threshold voltage of the MOS transistor 200 occurs due to the inverse narrow-channel effect.

From this, the MOS transistor 200 is suitable as MOS transistors such as a logic circuit or the like which require a high-speed operation (gate oxide film thickness: 1–4 nm; driving voltage: 0.8–1.8 V; threshold voltage: 0.15–0.6 V).

The driving voltage for an input/output circuit is normally 2.5 V or 3.3 V, which is converted into a voltage of 0.8 to 1.8 V by an internal circuit to be used as a driving voltage for a logic circuit or the like.

While the thick-film portion AR, as above described, is suitable for forming a semiconductor element constituting an input/output circuit, the thin-film portion BR is also suitable for forming a semiconductor element constituting an analog circuit.

More specifically, the analog circuit requires high transconductance to ensure gain. When the analog circuit and the input/output circuit are formed on one substrate, use of the MOS transistor 200 in the thin-film portion BR which has a low threshold voltage in the analog circuit increases transconductance, thereby achieving high gain. Further, variations in the threshold voltage can be reduced by controlling the formation of a recess around the active region 3B in the thin-film portion BR, which ensures steady transistor performance.

B. Second Preferred Embodiment

B-1. Device Configuration

Figure 14:
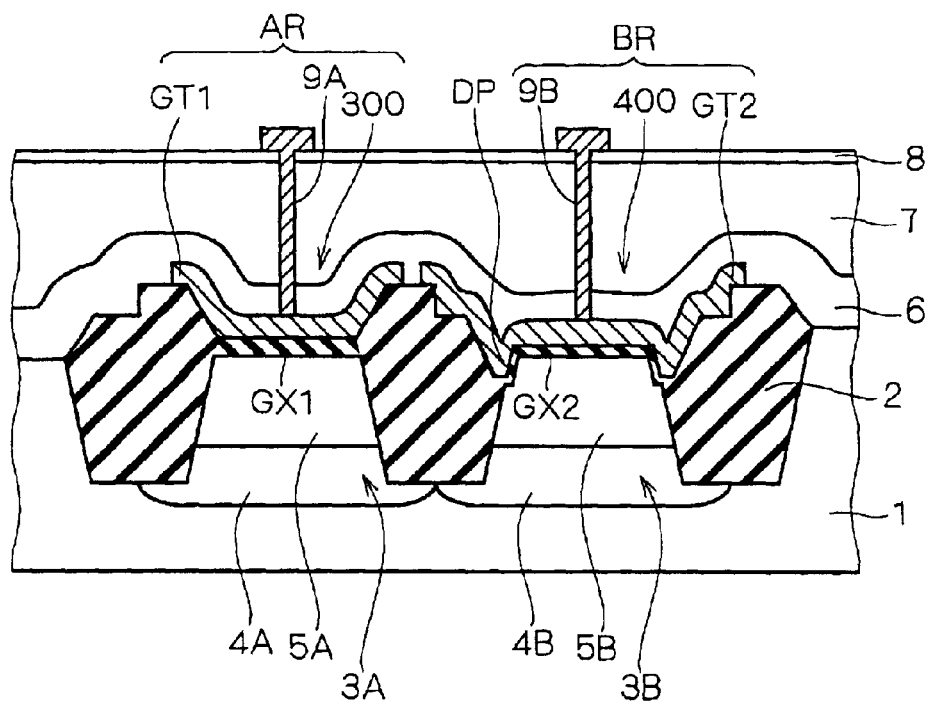
FIGS. 14 and 15 are cross-sectional views for explaining a configuration of a semiconductor device according to a second preferred embodiment of the present invention.
Figure 15:
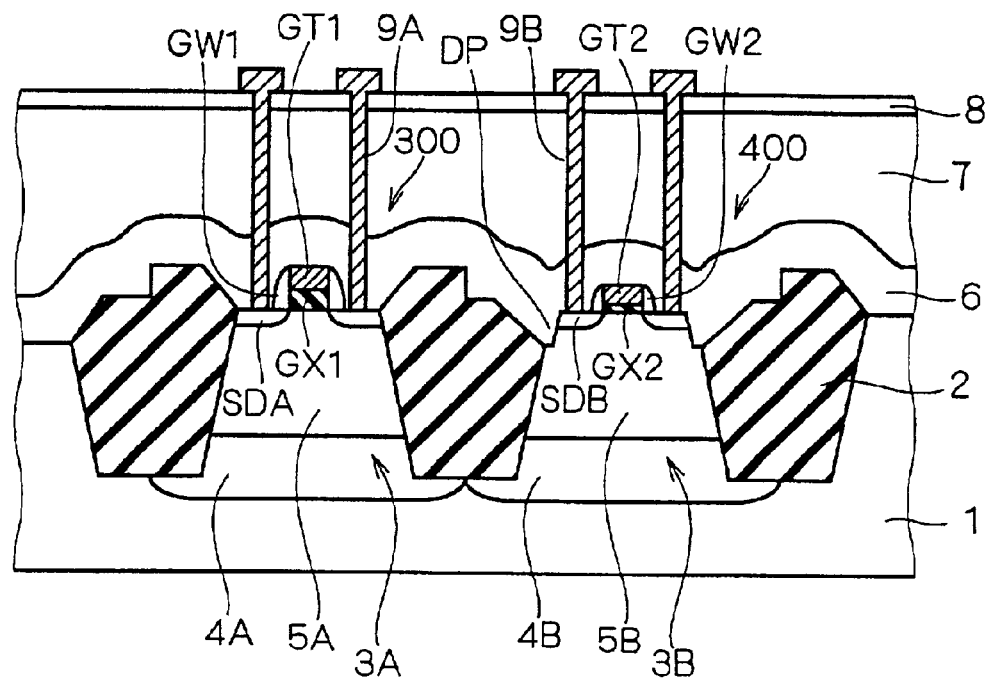

Referring now to FIGS. 14 and 15, two kinds of MOS transistors 300 and 400 formed by the dual oxide process according to the present invention will be described.

FIG. 14 shows cross-sectional shapes of the MOS transistors 300 and 400 longitudinally of their gates, and FIG. 15 shows cross-sectional shapes thereof transversely of their gates.

Referring to FIGS. 14 and 15, the MOS transistor 300 is formed with a relatively thick gate oxide film in the thick-film portion AR, and the MOS transistor 400 is formed with a relatively thin gate oxide film in the thin-film portion BR.

As shown in FIGS. 14 and 15, the isolation insulating film 2 which defines the active region 3B in the thin-film portion BR has an excessively removed edge portion on the side of the MOS transistor 400 and thereby a recessed portion DP is formed in the edge portion of the active region 3B. On the other hand, the edge portion of the isolation insulating film 2 on the side of the MOS transistor 300 in the thick-film portion AR is not excessively removed.

The other parts of identical configuration to those of the MOS transistors 100 and 200 described with reference to FIGS. 1 and 2 are denoted by the same reference numerals or characters and the description thereof will be omitted.

B-2. Manufacturing Method

Next, a method of manufacturing the MOS transistors 300 and 400 will be described step by step with reference to FIGS. 16 to 20.

Figure 16:
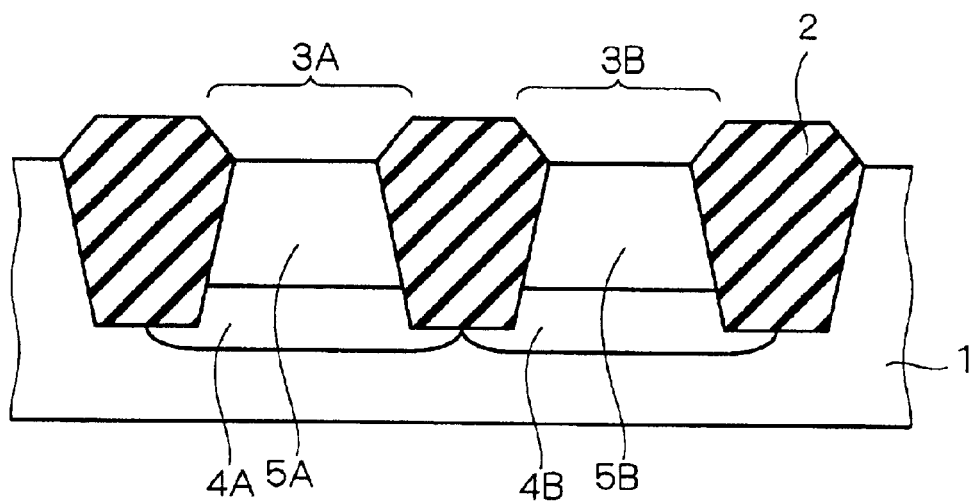
FIGS. 16 to 20 are cross-sectional views for explaining a manufacturing process for the semiconductor device according to the second preferred embodiment of the present invention.

In a step of FIG. 16, the isolation insulating film 2 is selectively formed in the surface of the semiconductor substrate 1 to define the active regions 3A and 3B. After formation of a thermal oxide film (not shown), the well regions 4A, 4B and the channel implant regions 5A, 5B are formed by impurity ion implantation, more specifically well formation and channel doping, in the active regions 3A and 3B.

The well formation and the ion implantation for forming a channel cut layer are performed under the same conditions as described in the first preferred embodiment. The same can be said of the channel doping.

Figure 17:
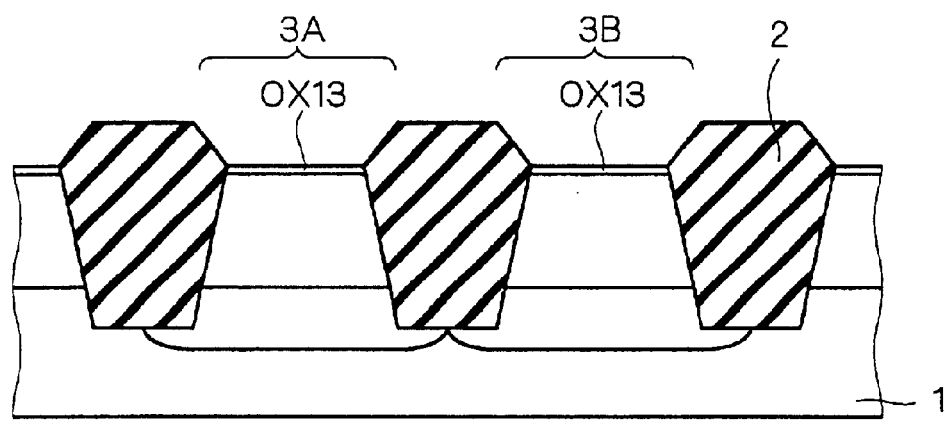

In a step of FIG. 17, the main surfaces of the active regions 3A and 3B are thermally oxidized to form the oxide film OX13 of a third thickness. Here the "third thickness" is defined as a resultant thickness from subtraction of a second thickness from a first thickness, where the first and second thicknesses are respectively the thicknesses of the gate oxide films GX1 and GX2 to be formed later.

Figure 18:
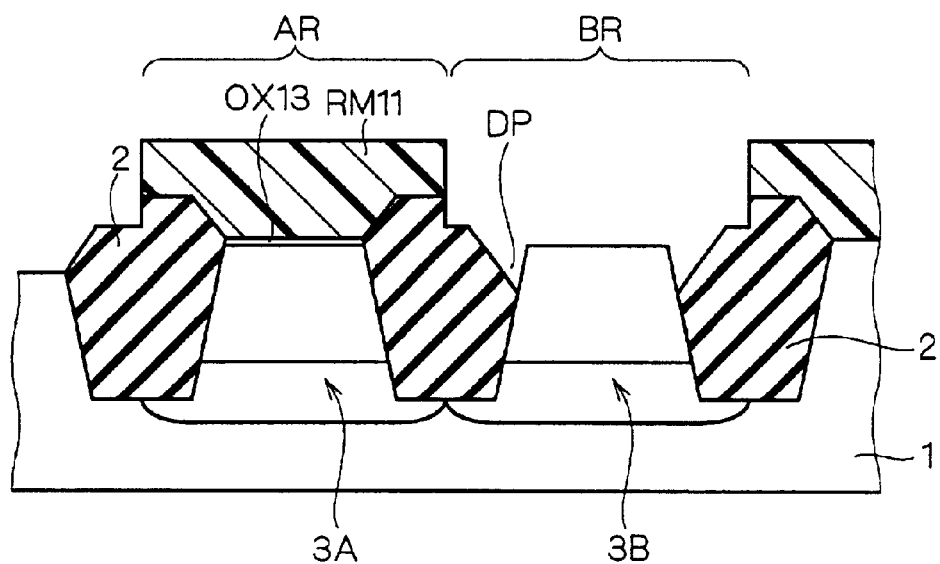

In a step of FIG. 18, a resist pattern RM11 is formed by a photolithographic technique to cover the thick-film portion AR.

Then, the oxide film OX13 in the thin-film portion BR is removed by wet etching which is performed for a longer period of time than the conventional predetermined period of time, whereby a deep recessed portion DP is formed around the active region 3A. For example, if a conventional etching process produces a recessed portion of about 5 nm in depth, the recessed portion DP of about 10 nm in depth can be formed by doubling the conventional etch time.

Figure 19:
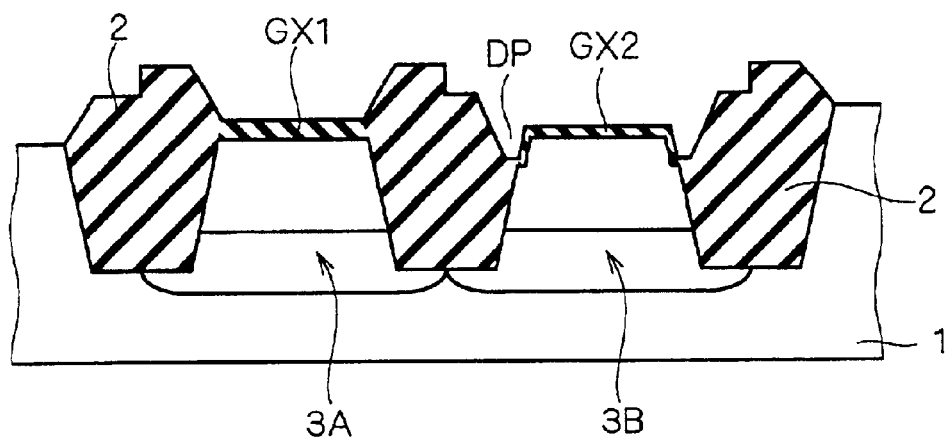

After removal of the resist pattern RM11, in a step of FIG. 19, the oxide film OX13 is increased in thickness by thermal oxidation or CVD to form the gate oxide film GX1 of the first thickness on top of the active region 3A. At this time, the gate oxide film GX2 of the second thickness is formed on top of the active region 3B.

Figure 20:
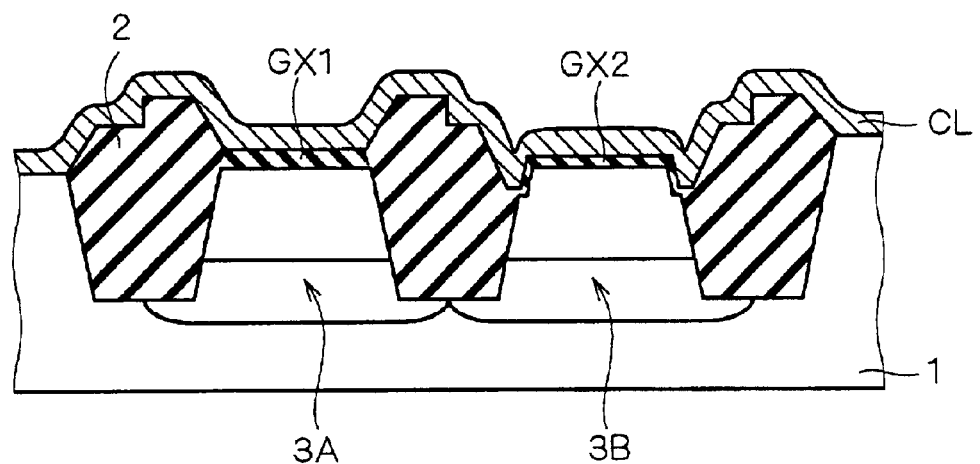

In a step of FIG. 20, the conducting layer CL to be the gate electrodes GT1 and GT2 is formed to cover the gate oxide films GX1 and GX2.

The conducting layer CL is then patterned to form the gate electrodes GT1 and GT2. With the gate electrodes GT1 and GT2 as masks, ion implantation is carried out to form the source/drain regions SDA and SDB in the active regions 3A and 3B, respectively.

Here the source/drain implants are performed under the same conditions as described in the first preferred embodiment.

After the interlayer insulation films 6 to 8 are laminated one above the other over the whole surface, the contact portions 9A and 9B are formed, reaching the source/drain regions SDA and SDB respectively through the interlayer insulation films 6 to 8. This provides the MOS transistors 300 and 400 shown in FIGS. 14 and 15.

B-3. Effects

The depth of the recessed portion DP around the active region 3B at the stage of FIG. 19 should preferably be about 10 nm (100 Å) at the minimum, the depth being defined as a depth between the main surface of the active region 3B and the deepest part of the recessed portion DP. For that, it is desirable that the depth of the recessed portion DP formed in the step of FIG. 18 be determined in consideration of lowering of the main surface level of the active region 3B by the formation of the oxide film OX13.

In order to form the recessed portion DP to a depth of about 10 nm around the active region 3B, the time for wet etching in the step of FIG. 17 should be lengthened than before.

For example, if a conventional etching process produces a recessed portion of about 5 nm in depth, the recessed portion DP of about 10 nm can be formed by doubling the conventional etch time.

By forming the recessed portion DP to a depth of at least about 10 nm around the active region 3B, the occurrence of variation in threshold voltage due to the inverse narrow-channel effect can be reduced even if the depth of the recessed portion DP varies. This improves manufacturing yield of the semiconductor device, the reason of which is the same as described in the first preferred embodiment.

In the MOS transistor 300 in the thick-film portion AR shown in FIG. 14, there is little recess around the edge of the active region 3A and very little, if any at all.

Therefore, no reduction in the threshold voltage of the MOS transistor 300 occurs due to the inverse narrow-channel effect.

From this, the MOS transistor 300 is for example suitable for a memory cell in an eRAM (embedded RAM), which brings about the effect of controlling problems such as deterioration of sub-leakage current and refresh capability.

While the thick-film portion AR, as has been described in the first preferred embodiment, is suitable for forming a semiconductor element constituting an input/output circuit, the thin-film portion BR is also suitable for forming a semiconductor element constituting an analog circuit.

More specifically, the analog circuit requires high transconductance to ensure gain. When the analog circuit and the input/output circuit are formed on one substrate, use of the MOS transistor 400 in the thin-film portion BR which has a low threshold voltage in the analog circuit increases transconductance, thereby achieving high gain. Further, variations in the threshold voltage can be reduced by forming the recessed portion DP of at least about 10 nm around the active region 3B in the thin-film portion BR, which ensures steady transistor performance.

C. Third Preferred Embodiment

C-1. Device Configuration

Figure 21:
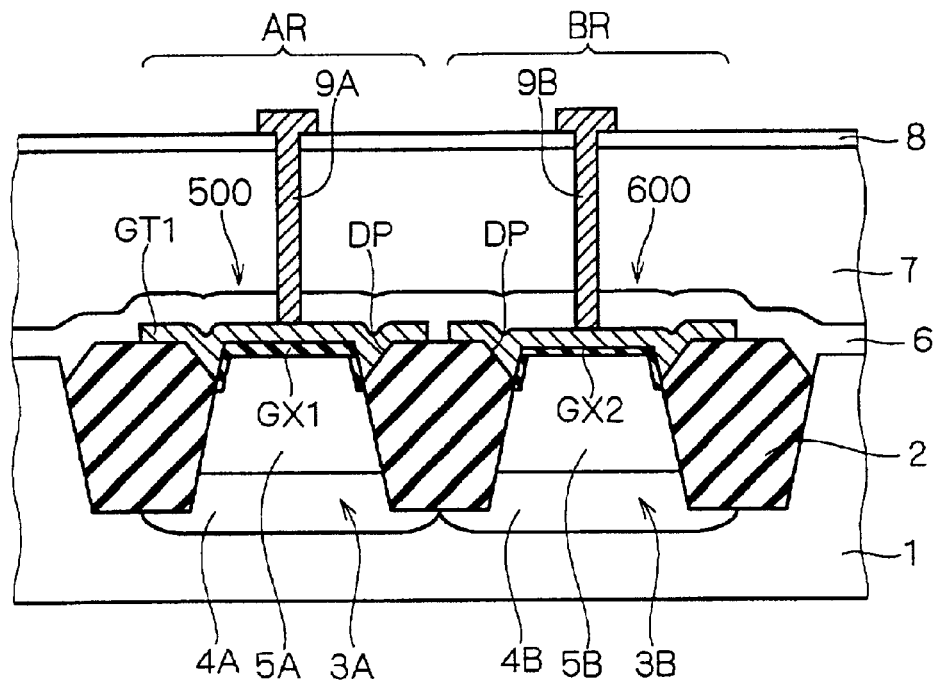
FIGS. 21 and 22 are cross-sectional views for explaining a configuration of a semiconductor device according to a third preferred embodiment of the present invention.
Figure 22:
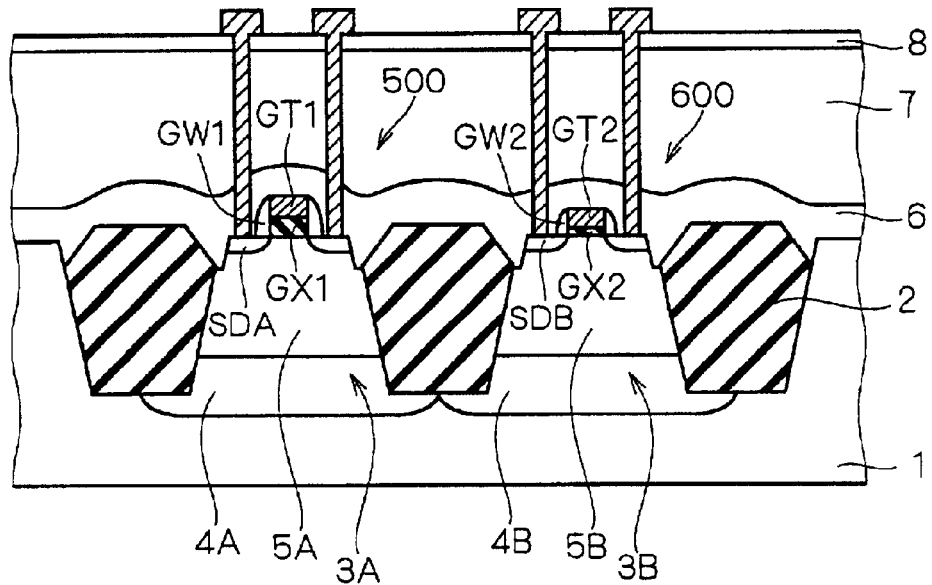

Referring now to FIGS. 21 and 22, two kinds of MOS transistors 500 and 600 formed by the dual oxide process according to the present invention will be described.

FIG. 21 shows cross-sectional shapes of the MOS transistors 500 and 600 longitudinally of their gates, and FIG. 22 shows cross-sectional shapes thereof transversely of their gates.

Referring to FIGS. 21 and 22, the MOS transistor 500 is formed with a relatively thick gate oxide film in the thick-film portion AR, and the MOS transistor 600 is formed with a relatively thin gate oxide film in the thin-film portion BR.

As shown in FIGS. 21 and 22, the isolation insulating film 2 which defines the active regions 3A and 3B in the thick-film portion AR and the thin-film portion BR has excessively removed edge portions on the sides of the MOS transistors 500 and 600. Thus, recessed portions (first and second recessed portions) DP are formed in the edge portions of the active regions 3A and 3B.

The other parts that are identical in configuration to those of the MOS transistors 100 and 200 described with reference to FIGS. 1 and 2 are denoted by the same reference numerals or characters and the description thereof will be omitted.

C-2. Manufacturing Method

Next, a method of manufacturing the MOS transistors 500 and 600 will be described step by step with reference to FIGS. 23 to 27.

First; after the oxide film OX11 is formed by thermal oxidation on the active regions 3A and 3B through the processes described with reference to FIGS. 3 and 4, the well regions 4A, 4B and the channel implant regions 5A, 5B are formed by impurity ion implantation, more specifically, by well formation and channel doping, in the active regions 3A and 5B.

Figure 23:
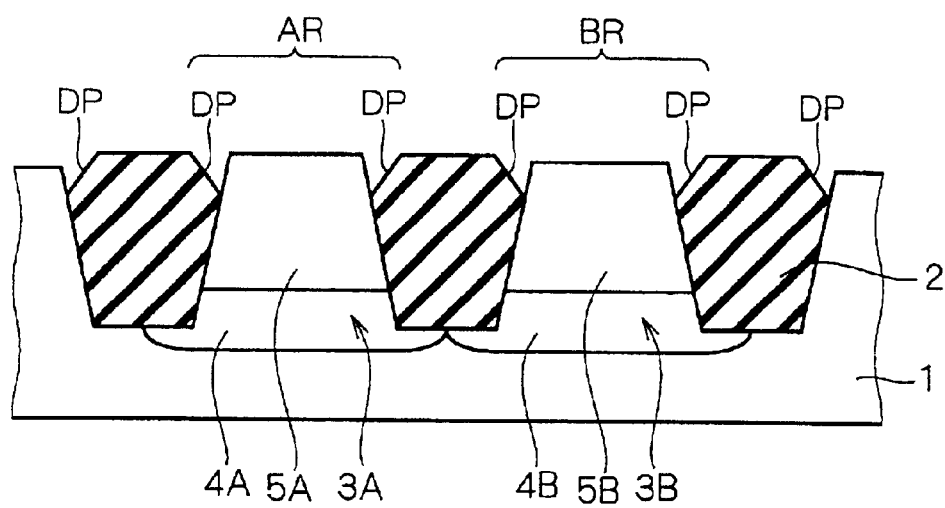
FIGS. 23 to 27 are cross-sectional views for explaining a manufacturing process for the semiconductor device according to the third preferred embodiment of the present invention.

In a step of FIG. 23, by wet etching of the silicon oxide film, the oxide film OX11 is removed and also the edge portion of the isolation insulating film 2 is removed. Thereby deep recessed portions DP are formed around the active regions 3A and 3B.

Figure 24:
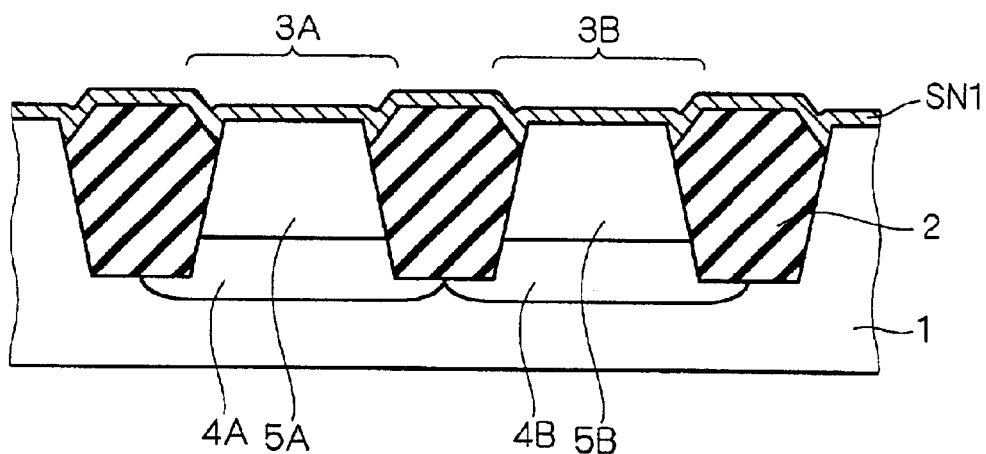

In a step of FIG. 24, the silicon nitride film SN1 is formed to a thickness of 5 to 30 nm (50–300 Å) over the whole surface.

Figure 25:
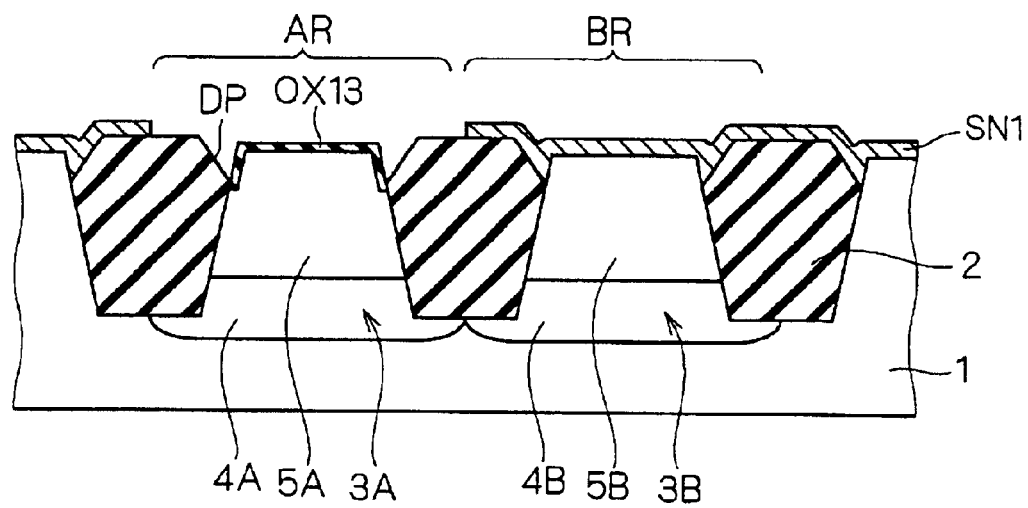

In a step of FIG. 25, the silicon nitride film SN1 is selectively removed by wet etching so that only the silicon nitride film SN1 in the thick-film portion AR is removed and, with the silicon nitride film SN1 left in the thin-film portion BR, the oxide film OX11 of a third thickness is formed only on the surface of the active region 3A. Here, the "third thickness" is defined as a resultant thickness of subtraction of a second thickness from a first thickness, where the first thickness and the second thickness are respectively the thicknesses of the gate oxide films GX1 and GX2 to be formed later.

Figure 26:
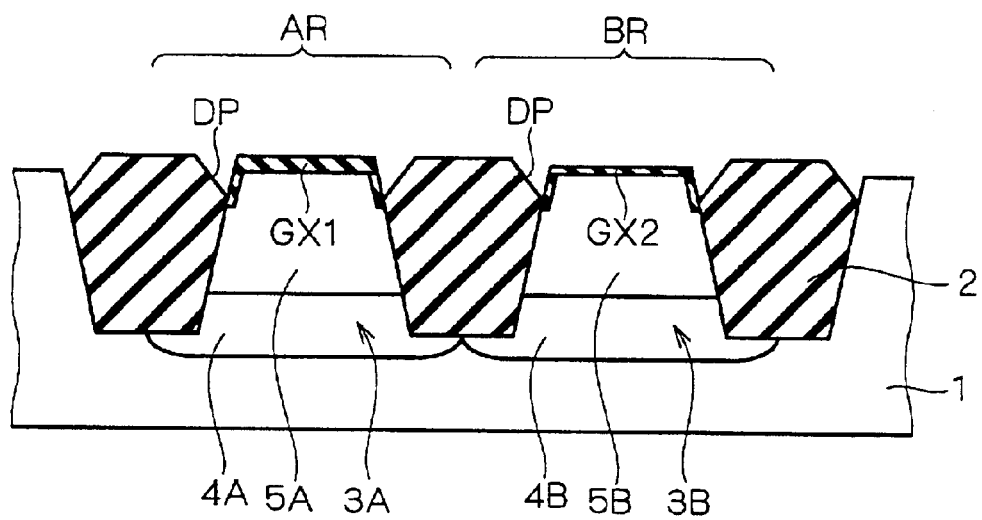

In a step of FIG. 26, the silicon nitride film SN1 remaining in the thin-film portion BR is removed by etching. This etching is performed on the condition that the silicon oxide film is not removed, so that little silicon oxide film is removed from the thick-film portion AR and the thin-film portion BR. Then, the oxide film OX13 is increased in thickness by thermal oxidation or CVD thereby to form the gate oxide film GX1 of the first thickness on top of the active region 3A. At this time, the gate oxide film GX2 of the second thickness is formed on top of the active region 3B.

Figure 27:
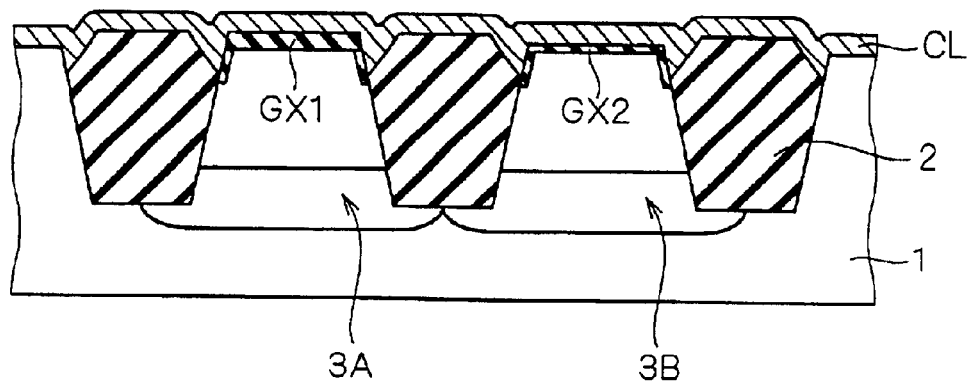
Figure 28:
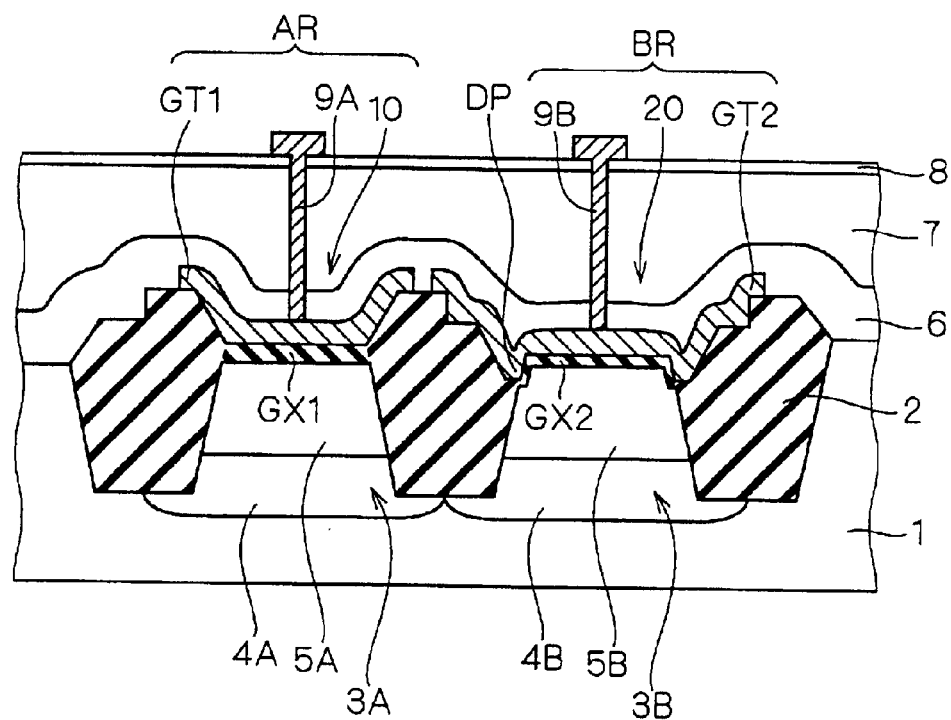
FIGS. 28 and 29 are cross-sectional views for explaining a configuration of a conventional semiconductor device.
Figure 29:
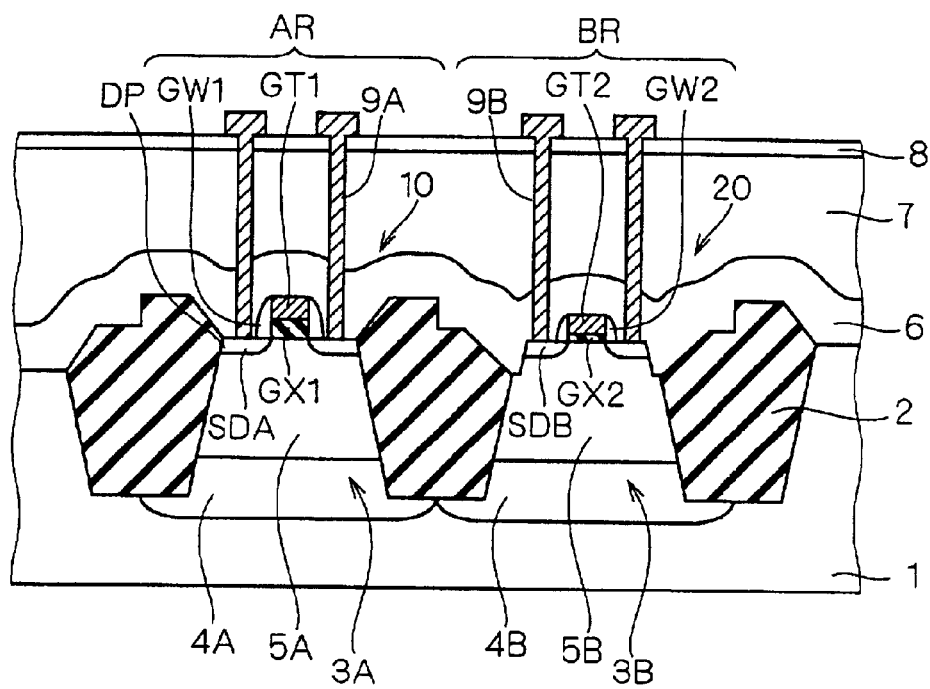
Figure 30:
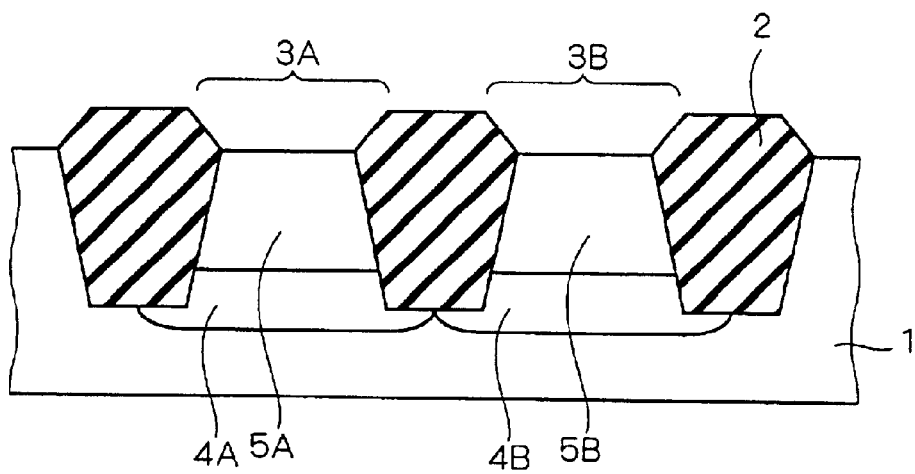
FIGS. 30 to 34 are cross-sectional views for explaining a manufacturing process for the conventional semiconductor device.
Figure 31:
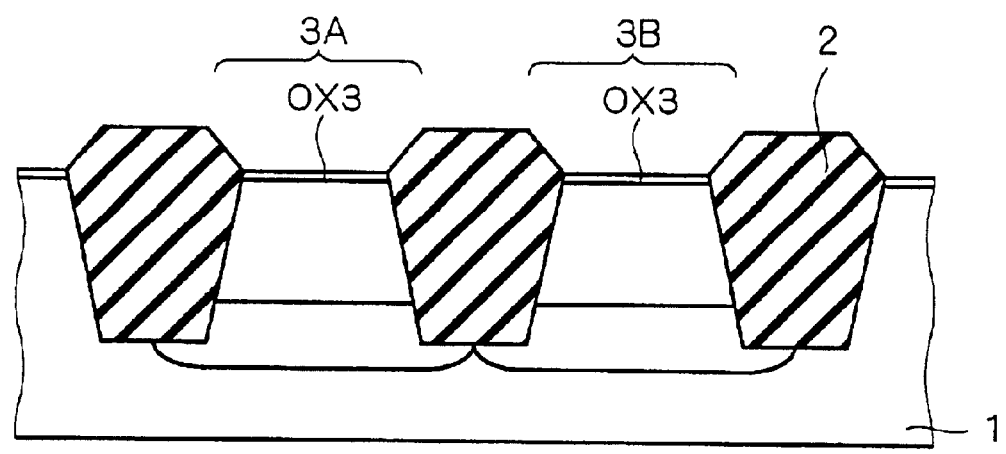
Figure 32:
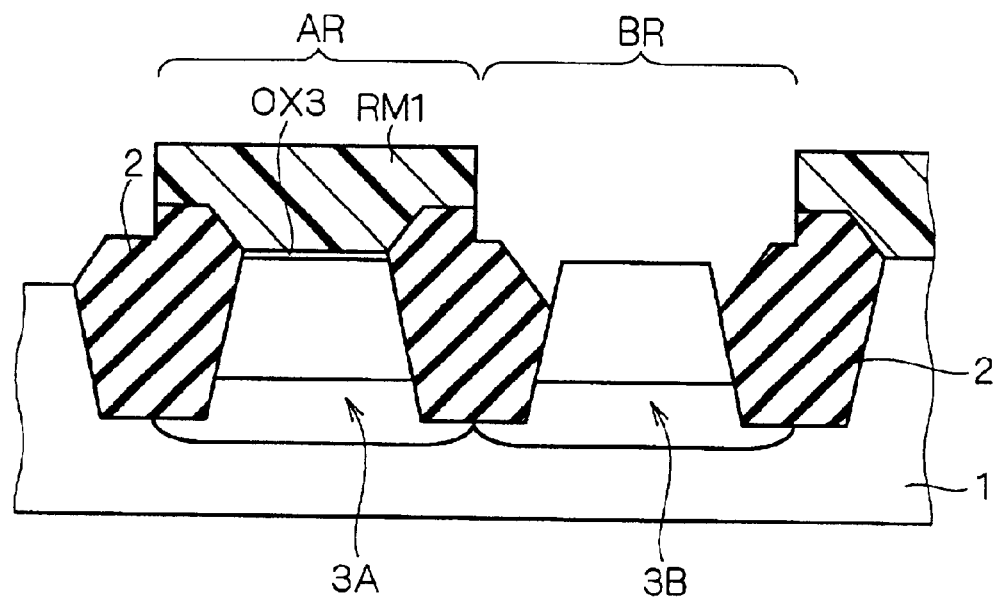
Figure 33:
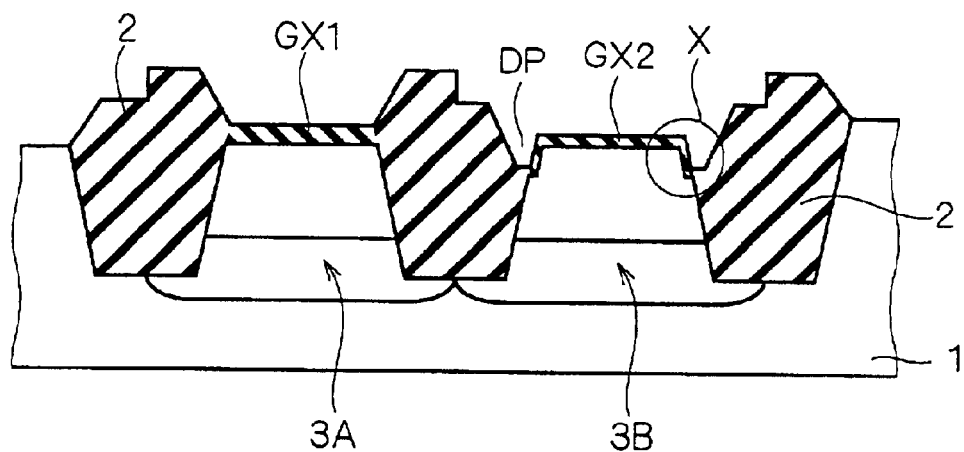
Figure 34:
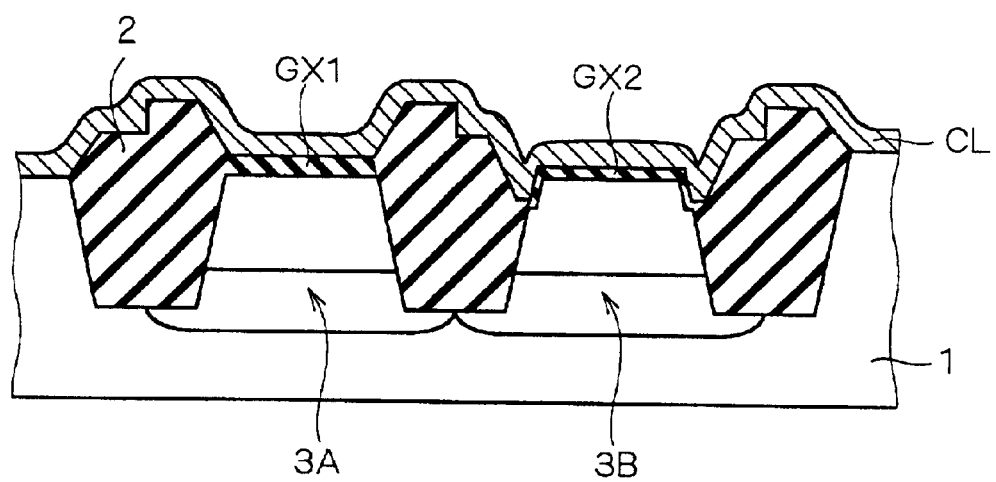
Figure 35:
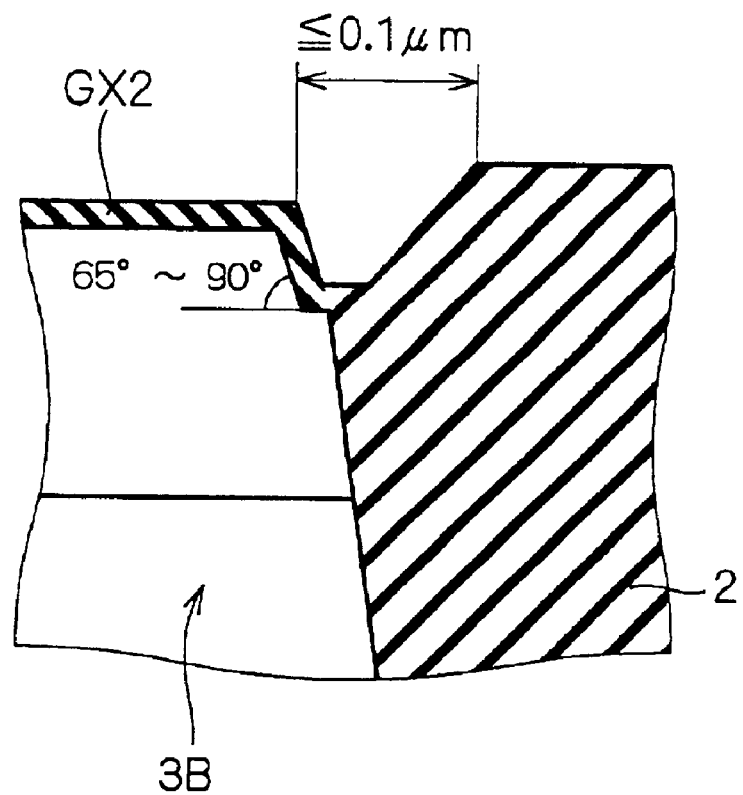
FIG. 35 shows part of the configuration of the conventional semiconductor device.

In a step of FIG. 27, the conducting layer CL to be the gate electrodes GT1 and GT2 is formed to cover the gate oxide films GX1 and GX2.

The conducting layer CL is then patterned to form the gate electrodes GT1 and GT2. With the gate electrodes GT1 and GT2 as masks, ion implantation is carried out to form the source/drain regions SDA and SDB in the active regions 3A and 3B, respectively.

Here the source/drain implants are performed under the same conditions as described in the first preferred embodiment.

After the interlayer insulation films 6 to 8 are laminated one above the other over the whole surface, the contact portions 9A and 9B are formed which reach the source/drain regions SDA and SDB respectively through the interlayer insulation films 6 to 8. This provides the MOS transistors 500 and 600 shown in FIGS. 21 and 22.

C-3. Effects

The depth of the recessed portions DP around the active regions 3A and 3B at the stage of FIG. 26 should preferably be about 10 nm (100 Å) at the minimum, the depth being defined as a depth between the main surfaces of the active regions 3A and 3B and the deepest part of the recessed portions DP. For that, it is desirable that the depth of the recessed portions DP formed in the step of FIG. 23 be determined in consideration of lowering of the main surface level of the active regions 3A and 3B by the formation of the oxide film OX13 and the gate oxide film GX2.

In order to form the recessed portions DP to a depth of about 10 nm around the active regions 3A and 3B, the time for wet etching in the step of FIG. 23 should be lengthened than before.

For example, if the conventional etching process produces recessed portions of about 5 nm in depth, the recessed portions DP of about 10 nm can be formed by doubling the conventional etch time.

By forming the recessed portions DP to a depth of at least about 10 nm around the active regions 3A and 3B, the occurrence of variation in threshold voltage due to the inverse narrow-channel effect can be reduced even if the depth of the recessed portion DP varies. This improves manufacturing yield of the semiconductor device, the reason of which is the same as described in the first preferred embodiment.

While the thick-film portion AR, as has been described in the first preferred embodiment, is suitable for forming a semiconductor element constituting an input/output circuit, the thin-film portion BR is also suitable for forming a semiconductor element constituting an analog circuit.

More specifically, the analog circuit requires high transconductance to ensure gain. When the analog circuit and be input/output circuit are formed on one substrate, use of the MOS transistor 600 in the thin-film portion BR which has a low threshold voltage in the analog circuit increases transconductance, thereby achieving high gain. Further, variations in the threshold voltage can be reduced by forming the recessed portion DP of at least about 10 nm around the active region 3B in the thin-film portion BR, which ensures steady transistor performance.

While the invention has been shown and described in detail, the foregoing description is in all aspects illustrative and not restrictive. It is therefore understood that numerous modifications and variations can be devised without departing from the scope of the invention.

What is claimed is:

1. The semiconductor device comprising:
   a semiconductor substrate;
   an isolation insulating film selectively located in a surface of said semiconductor substrate; and
   first and second transistors located respectively on first and second active regions which are defined by and in direct contact with said isolation insulating film,
   said first transistor having a first gate insulating film of a first thickness which is selectively located on said first active region,
   said second transistor having a second gate insulating film of a second thickness which is selectively located on said second active region,
   said first thickness being greater than said second thickness,
   said isolation insulating film having a recessed portion in an edge portion on the side of said first active region,
   said recessed portion being located around said first active region,
   a depth of said recessed portion is defined as a vertical height between a main surface of said first active region and a deepest part of said recessed portion, and is not less than 10 nm.

2. The semiconductor device according to claim 1, wherein said isolation insulating film has another recessed portion shallower than said recessed portion located around said first active region, in an edge portion on the side of said second active region,
   said shallower recessed portion is located around said second active region.

3. A semiconductor device comprising:
   a semiconductor substrate;
   an isolation insulating film selectively located in a surface of said semiconductor substrate; and
   a first transistor located on a first active region defined by and in direct contact with said isolation insulating film,
   said first transistor having a first gate insulating film of a first thickness which is selectively located on said first active region,
   said isolation insulating film having a first recessed portion in an edge portion on the side of said first active region, said first recessed portion being located around said first active region,
   a depth of said first recessed portion being defined as a vertical height between a main surface of said first active region and a deepest part of said first recessed portion and being not less than 10 nm.

4. The semiconductor device according to claim 3, further comprising:
   a second transistor located on a second active region which is defined by said isolation insulating film as being different from said first active region in the surface of said semiconductor substrate,
   said second transistor having a second gate insulating film of a second thickness which is selectively located on said second active region,
   said first thickness being greater than said second thickness,
   said isolation insulating film having a second recessed portion in an edge portion on the side of said second active region, said second recessed portion being located around said second active region,
   a depth of said second recessed portion being defined as a vertical height between a main surface of said second active region and a deepest part of said second recessed portion and being not less than 10 nm.

5. The semiconductor device according to claim 3, further comprising:
   a second transistor located on a second active region which is defined by said isolation insulating film as being different from said first active region in the surface of said semiconductor substrate,
   said second transistor having a second gate insulating film of a second thickness which is selectively located on said second active region,
   said first thickness being greater than said second thickness,
   said isolation insulating film having a second recessed portion in an edge portion on the side of said second active region, said second recessed portion being located around said second active region.

6. The semiconductor device according to claim 3, wherein
   said first transistor includes a transistor forming an input/output circuit, and
   said second transistor includes a transistor forming an analog circuit.

7. The semiconductor device according to claim 5, wherein
   said first transistor includes a transistor forming an input/output circuit, and
   said second transistor includes a transistor forming an analog circuit.

8. The semiconductor device according to claim 5, wherein
   said first transistor includes a transistor forming an input/output circuit, and
   said second transistor includes a transistor forming an analog circuit.

* * * * *